(12) United States Patent
Song

(10) Patent No.: US 11,121,237 B2
(45) Date of Patent: Sep. 14, 2021

(54) MANUFACTURING METHOD FOR FINFET DEVICE

(71) Applicant: SHANGHAI IC R&D CENTER CO., LTD., Shanghai (CN)

(72) Inventor: Lei Song, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 0 days.

(21) Appl. No.: 16/771,682

(22) PCT Filed: Aug. 29, 2018

(86) PCT No.: PCT/CN2018/102886
§ 371 (c)(1),
(2) Date: Jun. 11, 2020

(87) PCT Pub. No.: WO2019/119861
PCT Pub. Date: Jun. 27, 2019

(65) Prior Publication Data
US 2021/0091208 A1    Mar. 25, 2021

(30) Foreign Application Priority Data
Dec. 21, 2017   (CN) .......................... 201711391067.2

(51) Int. Cl.
*H01L 29/786*    (2006.01)
*H01L 21/8234*   (2006.01)
(Continued)

(52) U.S. Cl.
CPC .................. *H01L 29/66795* (2013.01); *H01L 21/823418* (2013.01); *H01L 21/823431* (2013.01);
(Continued)

(58) Field of Classification Search
CPC ..... H01L 21/823418; H01L 21/823431; H01L 21/823814; H01L 21/823821;
(Continued)

(56) References Cited

U.S. PATENT DOCUMENTS

| 6,605,847 B2 * | 8/2003 | Kim .................. H01L 29/78654 257/401 |
| 7,884,004 B2 * | 2/2011 | Bangsaruntip ........ H01L 29/775 438/586 |

(Continued)

FOREIGN PATENT DOCUMENTS

| CN | 101604705 | * 7/2011 | ............. H01L 29/78 |
| CN | 105097549 | * 11/2015 | ............. H01L 29/78 |

OTHER PUBLICATIONS

English Translation of Written Opinion for International Application No. PCT/CN2018/102886 (Year: 2018).*

*Primary Examiner* — Mary A Wilczewski
(74) *Attorney, Agent, or Firm* — Tianchen LLC.; Yuan R. Li; Yi Fan Yin

(57) ABSTRACT

The invention discloses a manufacturing method for FinFET device, comprises following steps: S01: providing an SOI substrate; S02: covering a middle part of the top silicon layer by using a barrier layer, and performing a silicon ion implantation on the top silicon layer, so that the buried insulator layer under the top silicon layer not covered by the barrier layer is converted into silicon-rich silicon dioxide, wherein in the top silicon layer, the part not covered by the barrier layer is called an implanted region, and the part covered by the barrier layer is called a non-implanted region; S03: removing the barrier layer, define a fin structure in the top silicon layer, the fin structure includes a channel and a source and drain, the source and drain are located on opposite sides of the channel; and the channel in the fin structure is located in the non-implanted region of the top (Continued)

silicon layer, the source and drain are located in the implanted region of the top silicon layer; removing the top silicon layer outside the fin structure; S04: removing the buried insulator layer under the channel in the fin structure to form a suspended channel; S05: forming a completely surrounded dielectric film and a gate in sequence around the suspended channel; S06: forming spacers and a source-drain doping in the structure.

10 Claims, 3 Drawing Sheets

(51) Int. Cl.
  *H01L 29/66* (2006.01)
  *H01L 27/12* (2006.01)
  *H01L 29/423* (2006.01)
  *H01L 29/78* (2006.01)
(52) U.S. Cl.
  CPC ..... *H01L 27/1211* (2013.01); *H01L 29/42392* (2013.01); *H01L 29/785* (2013.01)
(58) Field of Classification Search
  CPC ......... H01L 29/42392; H01L 29/66772; H01L 29/66795; H01L 29/785; H01L 29/78654; H01L 29/78696; H01L 27/0886; H01L 27/1211; H01L 2029/7858
  See application file for complete search history.

(56) References Cited

U.S. PATENT DOCUMENTS

| | | | |
|---|---|---|---|
| 7,915,167 B2* | 3/2011 | Radosavljevic .. | H01L 29/66545 438/689 |
| 8,173,993 B2* | 5/2012 | Bangsaruntip .... | H01L 29/78696 257/38 |
| 2004/0152272 A1* | 8/2004 | Fladre ............... | H01L 29/42384 438/284 |
| 2005/0121703 A1* | 6/2005 | Hieda ............... | H01L 29/66795 257/288 |
| 2005/0189589 A1* | 9/2005 | Zhu .................... | H01L 29/78603 257/347 |
| 2005/0224889 A1* | 10/2005 | Oh .................... | H01L 29/66795 257/369 |
| 2006/0071291 A1* | 4/2006 | Yagishita .......... | H01L 29/66795 257/471 |
| 2021/0091208 A1* | 3/2021 | Song ................. | H01L 29/42392 |

* cited by examiner

MANUFACTURING METHOD FOR FINFET DEVICE

CROSS-REFERENCE TO RELATED APPLICATION

This application claims priority of International Patent Application Serial No. PCT/CN2018/102886, filed Aug. 29, 2018, which is related to and claims priority of Chinese patent application Serial No. 201711391067.2, filed Dec. 21, 2017. The entirety of each of the above-mentioned patent applications is hereby incorporated herein by reference and made a part of this specification.

TECHNICAL FIELD

The present disclosure relates to a manufacturing process of a semiconductor, and particularly to a manufacturing method of a FinFET device.

BACKGROUND

With reduction of MOS device size, control ability of gate to channel is gradually weakened, and short channel effect continues to increase. This will cause problems such as increased off-state leakage current and degradation of sub-threshold characteristics. To ensure the continuation of Moore's Law under the 28 nm process node, the industry has proposed two solutions: bulk silicon FinFET and full depleted (FD) SOI. The FinFET device uses a three-dimensional structure, which minimizes the short-channel effect and increases the drive current by adding gate-controlled channels on the side. The FD SOI devices still adopt planar structure, and ultra-thin body and BOX (UTBB) are used to improve the gate control capability and minimize the short channel effect.

The quadruple-gate MOS device based on SOI material (also known as surrounding-gate SOI MOS device) combines the advantages of FinFET and SOI, and adopts a fully enclosed gate to control the device channel. The device structure can achieve the best gate control ability in theory, greatly minimize the short channel effect, and increase the drive current of the device.

The manufacturing difficulties of the structure are mainly as follows: in process of etching a buried insulator layer directly under the channel to form a suspended channel, the buried insulator layer along the channel direction, that is, close to the Fin source and drain will also be etched. In order to form the suspended channel structure, thickness of over-etching is usually half of the width of the channel in the Fin structure, to ensure that the buried insulator layer directly below the channel is completely etched from both sides, which also means that the buried insulator layer directly under the source and drain on opposite sides of channel should also be overetched to remove the corresponding part. The overetching under the source and drain will change the original channel length, this change has little effect on the performance of long channel devices, however, has a huge impact on performance of short channel device. Therefore, the conventional manufacturing method is not suitable for devices with short channels, which is unfavorable for the device size reduction.

SUMMARY

The purpose of the present disclosure is to make up for the deficiencies of the above-mentioned prior art, and to provide a manufacturing method for a FinFET device, which can make the FinFET device have a stable fully enclosed gate structure, and improve the gate control capability and drive current of the device.

In order to achieve the above purpose, the present disclosure adopts the following technical solution: a manufacturing method for FinFET device, comprises following steps:

S01: providing an SOI substrate, wherein the SOI substrate includes a top silicon layer, a buried insulator layer, and a substrate sequentially from top to bottom, wherein the buried insulator layer is silicon dioxide;

S02: covering a middle part of the top silicon layer by using a barrier layer, and performing a silicon ion implantation on the top silicon layer, so that the buried insulator layer under the top silicon layer not covered by the barrier layer is converted into silicon-rich silicon dioxide, wherein in the top silicon layer, the part not covered by the barrier layer is called an implanted region, and the part covered by the barrier layer is called a non-implanted region;

S03: removing the barrier layer, define a fin structure in the top silicon layer, the fin structure includes a channel and a source and drain, the source and drain are located on opposite sides of the channel; and the channel in the fin structure is located in the non-implanted region of the top silicon layer, the source and drain are located in the implanted region of the top silicon layer; removing the top silicon layer outside the fin structure;

S04: removing the buried insulator layer under the channel in the fin structure to form a suspended channel;

S05: forming a completely surrounded dielectric film and a gate in sequence around the suspended channel;

S06: forming spacers and a source-drain doping in the structure.

Further, the SOI substrate includes a p-type doped top silicon layer, a buried insulator layer, and a p-type doped substrate sequentially from top to bottom.

Further, the channel in the fin structure has a circular cross section or a square cross section.

Further, in the step S02, the silicon ion implantation is performed above the top silicon layer to ensure that the peak value of the implanted silicon concentration distribution is in the buried insulator layer.

Further, in the step S03, the top silicon layer outside the fin structure is removed by dry etching.

Further, in the step S04, the buried insulator layer under the channel in the fin structure is removed by wet etching.

Further, the wet etching uses HF as a wet etching agent.

Further, the dielectric film is formed by one or more of high dielectric constant materials such as silicon dioxide, silicon nitride, and hafnium dioxide.

Further, the gate is formed of polysilicon or metal materials.

Further, the spacers are formed of insulating materials such as silicon dioxide and silicon nitride.

The beneficial effects of the present disclosure are as follows: the disclosure provides a manufacturing method for a FinFET device, through photolithography and silicon ion implantation, part of the SOI buried insulator layer (silicon dioxide) is converted into silicon-rich silicon dioxide, and etching rate is reduced. In the subsequent etching to remove the silicon dioxide under the channel, the buried insulator layer in the channel direction close to the fin source and drain is etched weakly, which is suitable for the manufacturing of short channel FinFET devices. At the same time, the present invention uses silicon ion implantation, does not change the initial doping concentration of the top silicon layer, and is beneficial to ensuring the stability and uniformity of the electrical parameters of the device. Moreover, silicon ion implantation does not introduce additional pollution impurities, which is beneficial to the reliability of the process and the device.

In the picture: 100 substrate, 101 buried insulator layer, 102 top silicon layer, 102' fin structure, 103 silicon-rich silicon dioxide, 104 dielectric film, 105 gate, 200 barrier layer.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

A manufacturing method for a FinFET device provided by the present disclosure includes the following steps:

S01: An SOI substrate is provided, and the SOI substrate includes, in order from top to bottom, a top silicon layer, a buried insulator layer, and a substrate.

Figure 1:
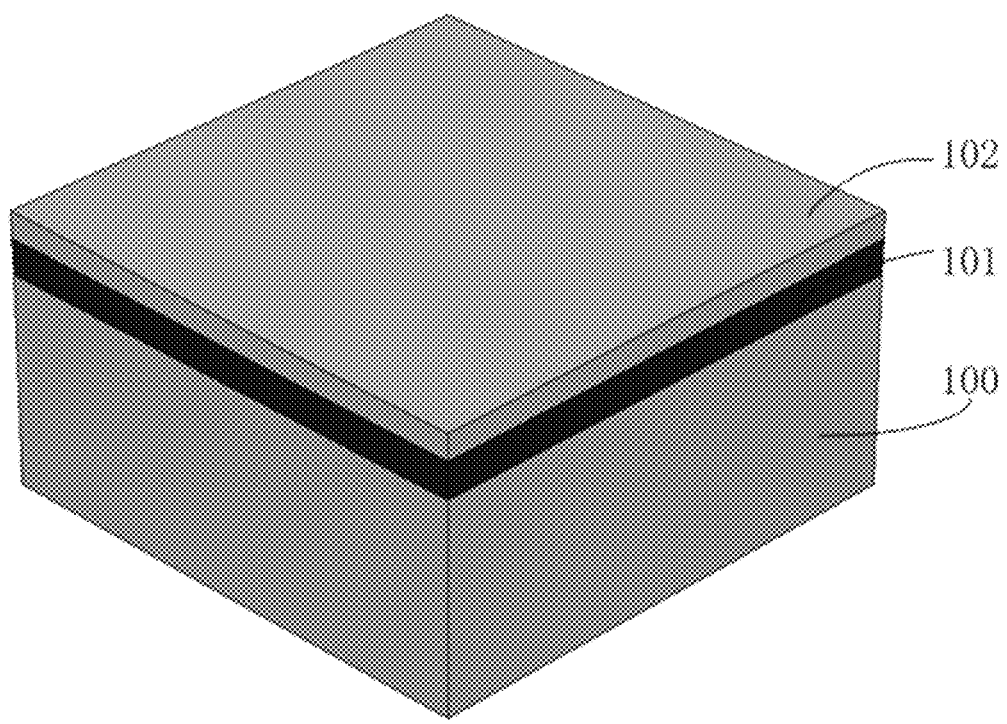
FIGS. 1 to 5 are process flow diagrams of an implementation example according to an exemplary embodiment of the disclosure.

As shown in FIG. 1, it is a conventional p-type doped SOI wafer. Wherein, in this embodiment, the SOI substrate includes p-type doped top silicon layer, buried insulator layer (silicon dioxide), p-type doped substrate sequentially from top to bottom, 100 is a p-type doped substrate, usually is low resistance, high resistance or trap rich. 101 is a buried insulator layer, which is a silicon dioxide layer, and its typical thickness is 15~250 nm. 102 is a p-type doped top silicon layer, with a typical thickness of 10~200 nm. The doping type of the SOI substrate does not affect the manufacturing method of the present disclosure, therefore, an n-type doped SOI wafer can also be used here, and the subsequent steps are operated by a similar method.

Figure 2:
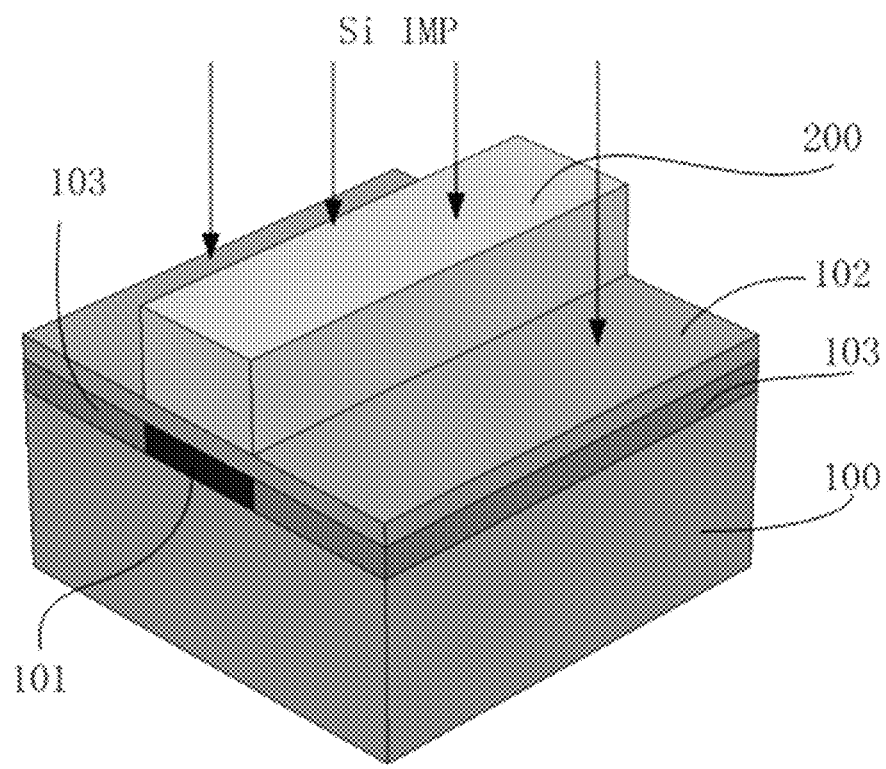

S02: As shown in FIG. 2, a middle part of the top silicon layer is covered with a barrier layer, and silicon ion implantation is performed on the top silicon layer so that the buried insulator layer under the top silicon layer not covered by the barrier layer is converted into silicon-rich silicon dioxide, wherein, the part of the top silicon layer that is not covered by the barrier layer is called an implanted region, and the part covered by the barrier layer is called the non-implanted region.

Wherein, the implanted region is defined by photolithography, and silicon ion implantation is performed, as shown in FIG. 2. wherein, 200 is a barrier layer, which can be used as photoresist; silicon ion is not implanted into the buried insulator layer area below it, so it is still the buried insulator layer 101. Other buried insulator layers not covered by the photoresist form silicon-rich silicon dioxide 103 due to the implantation of silicon ions. That is to say, in the part covered by the barrier layer, the buried insulator layer under it remains the same as before; after the silicon ion implantation, the part without the barrier layer is implanted with silicon ions to form silicon-rich silicon dioxide 103. In subsequent etching with HF solution, the etching rate of the silicon-rich silicon dioxide 103 is lower than that of the buried insulator layer 101 region. Therefore, the etching in the channel direction can be effectively reduced.

In FIG. 2, the energy and dose of silicon ion implantation are determined by the thickness of the top silicon layer 102 and the buried insulator layer 101. The selected implantation energy should ensure that the peak value of the silicon concentration distribution is in the buried insulator layer 101, and its typical value is 10~200 keV. For thinner top silicon layer 102, the implant energy is generally smaller. For thicker top silicon layer 102, the implant energy is relatively large. The selected implantation dose should ensure the formation of silicon-rich silicon dioxide, with a typical value of $1\times10^{10}/cm^2$ to $1\times10^{18}/cm^2$. Wherein, for the thinner buried insulator layer 101, the implantation dose is generally small, and one-time implantation is used. For a thicker buried insulator layer 101, the implantation dose is larger, and usually, multiple implantations are used.

The invention uses silicon ion implantation, does not change the initial doping concentration of the top silicon layer, and is beneficial to ensure the stability and uniformity of the electrical parameters of the device. At the same time, silicon ion implantation does not introduce additional pollution impurities, which is beneficial to the reliability of the process and the device.

Figure 3:
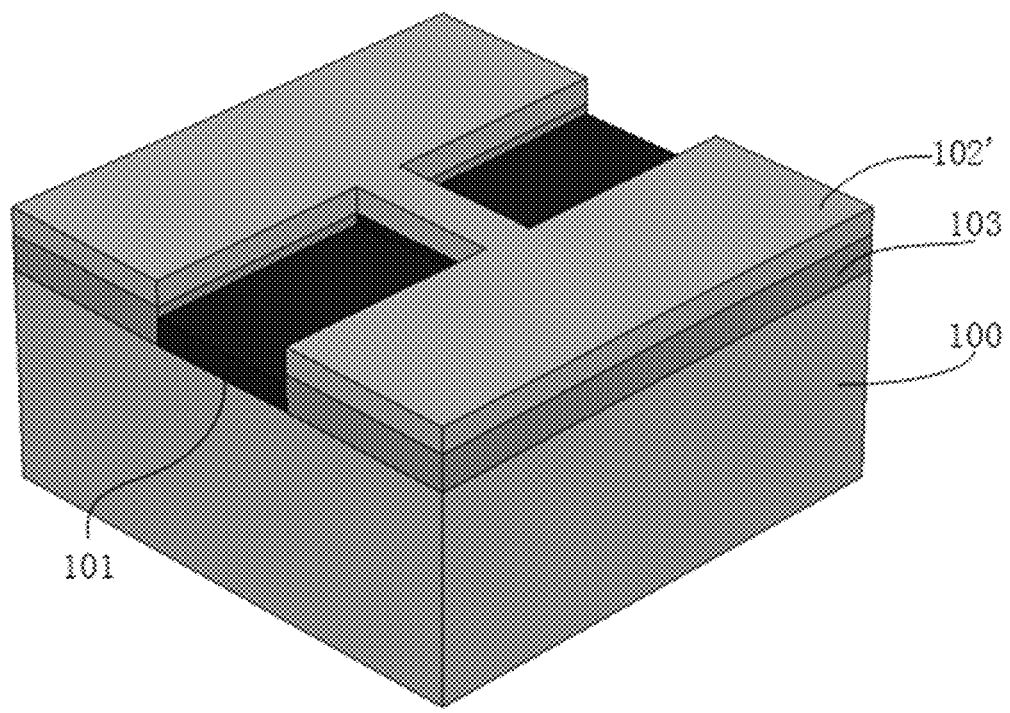

S03: As shown in FIG. 3, the barrier layer is removed, and a fin structure is defined in the top silicon layer, the fin structure includes a channel and a source and drain, the source and drain are located on opposite sides of the channel; and the channel in the fin structure is located in the non-implanted region of the top silicon layer, the source and drain are located in the implanted region of the top silicon layer; remove the top silicon layer outside the fin structure. In the present disclosure, the channel shape may be a rectangular channel with a square cross section in FIG. 3, or a circular cylinder with a circular cross section or other shapes.

After removing the barrier layer 200, the fin structure is defined by photolithography, and dry etching is performed to remove the top silicon layer 102 and the buried insulator layer 101. The resulting structure is shown in FIG. 3. Where 102' is a fin structure, the top silicon layer 102 outside the fin structure is completely etched, and the buried insulator layer 101 is partially etched. The buried insulator layer under fin is not etched, includes the buried insulator layer 101 under the channel and the silicon-rich silicon dioxide 103 under the source and drain.

When dry etching the top silicon layer 102 and the buried insulator layer (silicon dioxide) 101, the buried insulator layer (silicon dioxide) 101 can be completely etched until the substrate silicon 100 is exposed, or a certain thickness of the buried insulator layer (silicon dioxide) 101 remains, alternatively, only the top silicon layer is etched and the buried insulator layer (silicon dioxide) 101 is not etched.

Figure 4:
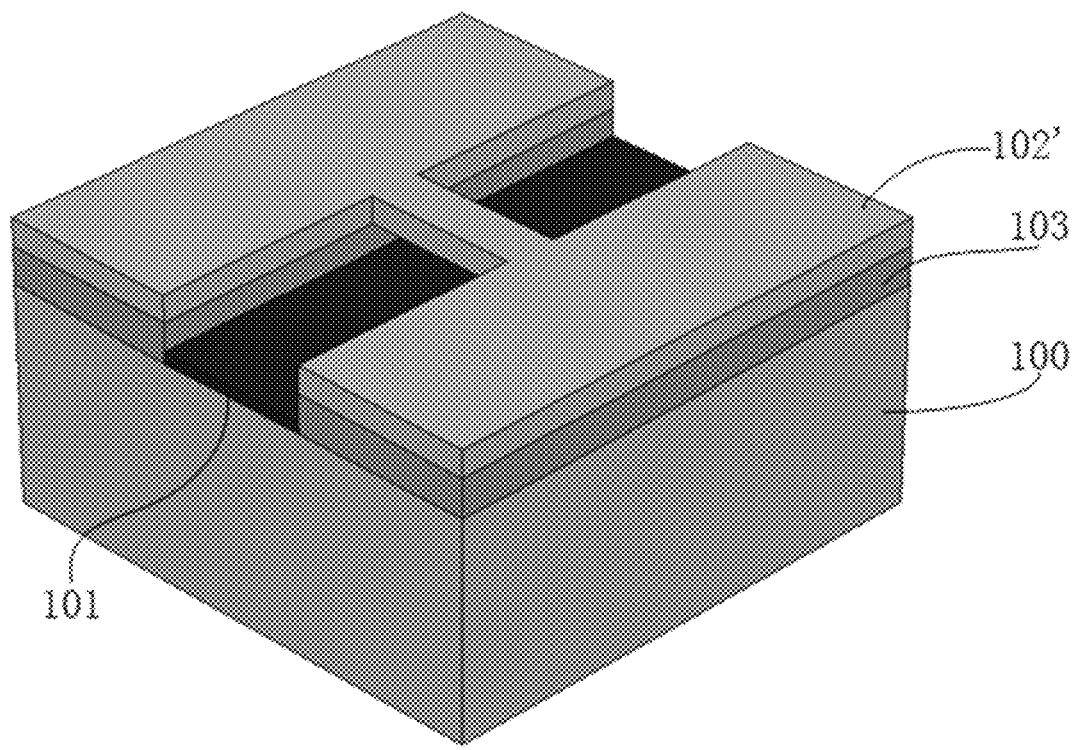

S04: As shown in FIG. 4, the buried insulator layer (silicon dioxide) under the channel in the fin structure is removed to form a suspended channel.

Wherein, wet etching is used to remove the buried insulator layer (silicon dioxide) 101 under the channel to form a suspended channel structure, as shown in FIG. 4. Since the etching rate of the silicon-rich silicon dioxide 103 under the source and drain is lower than that of the buried insulator layer 101 under the channel, when the buried insulator layer 101 under the channel is completely etched, The silicon dioxide 103 is substantially not etched. Due to support of the silicon-rich silicon dioxide 103 at both ends of the source and drain, the channel is in a stable suspended state.

In FIG. 4, when the buried insulator layer (silicon dioxide) 101 under the channel is removed by the wet etching, the thickness of the etching is at least half of the width of the fin structure. Usually, a diluted HF solution is used as an etching agent. In the present disclosure, whether the buried insulator layer under the channel is completely etched has no effect on the present invention. In order to enable subsequent dielectric films and gates to surround the channel, in this embodiment we have the width of the buried insulator layer under the channel etched in the direction perpendicular to the channel is greater than or equal to half of the channel width in the fin structure, where the channel width refers to width on the horizontal plane of the fin structure, the rectangular channel in the direction perpendicular to the channel.

Figure 5:
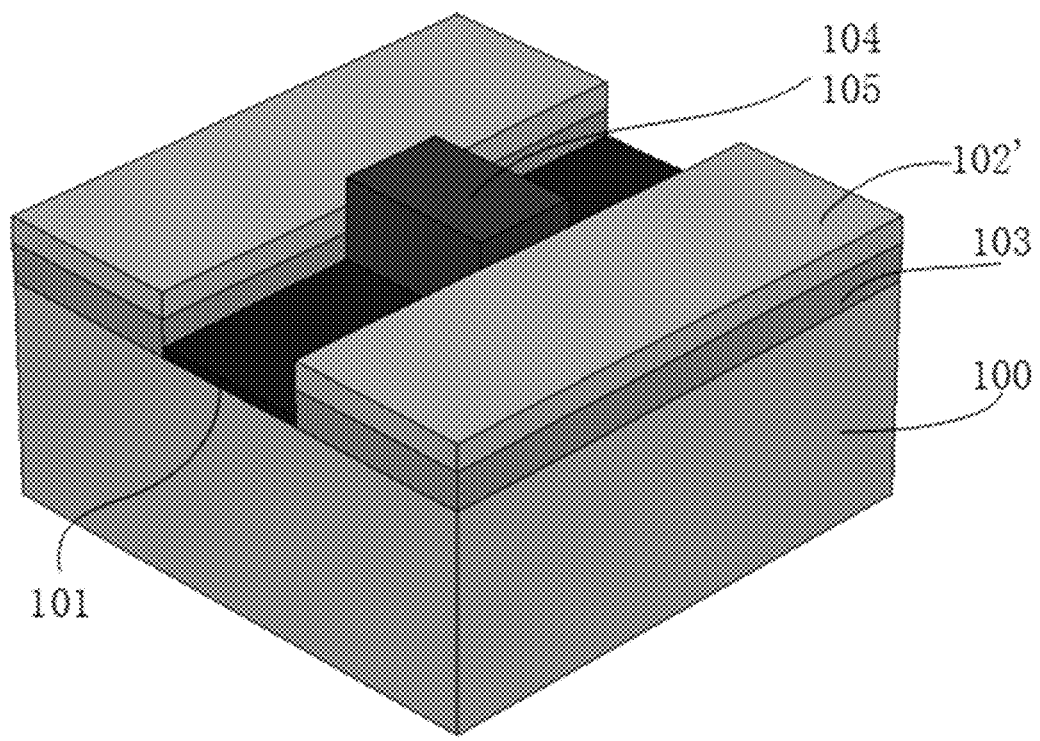

S05: As shown in FIG. 5, a completely surrounded dielectric film and a gate are sequentially formed around the above-mentioned suspended channel.

In FIG. 5, a dielectric film 104 and the gate 105 to form a fully enclosed gate structure. The dielectric film is formed by one or more of high dielectric constant materials such as silicon dioxide, silicon nitride, and hafnium dioxide, etc. Which is uniformly formed on the surface of the suspended channel by thermal growth. The gate is formed of polysilicon or metal material.

S06: forming spacers and source-drain doping in the above structure. Finally, conventional process steps are used to form spacers and source-drain doping. The spacers are formed of insulating materials such as silicon dioxide and silicon nitride. The source and drain are doped by ion implantation. For NMOS devices, the doping type is n-type, including one or more doping combinations of phosphorus and arsenic, etc.; for PMOS devices, the doping type is p-type, including one or more doping combinations of boron and boron difluoride, etc. After the ion implantation, an annealing process is used to activate source-drain doping.

Figure 6:
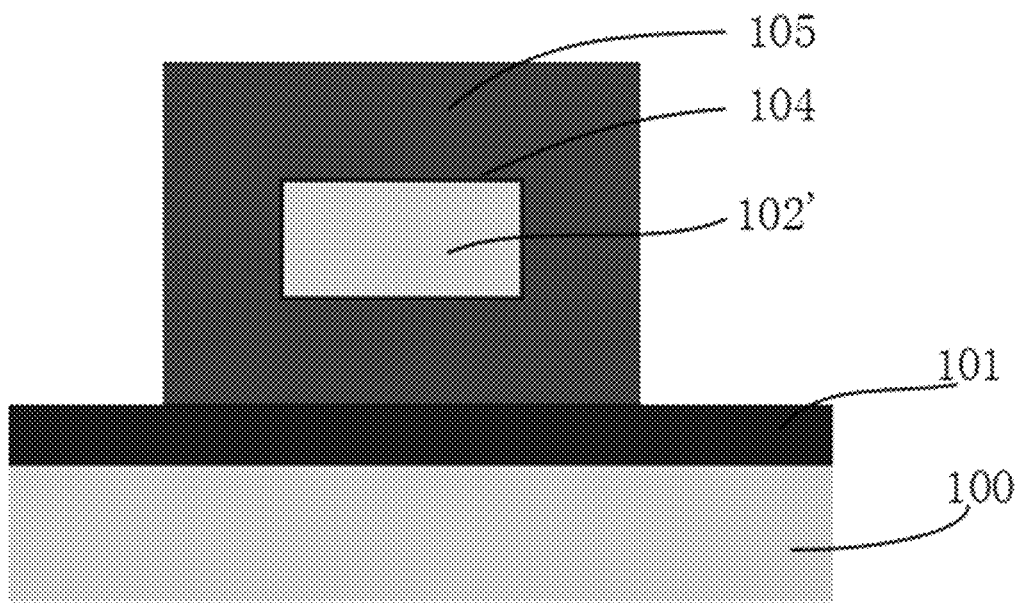
FIG. 6 is a cross-sectional view of a FinFET device according to an exemplary embodiment of the disclosure.

The cross-sectional view of the FinFET device according to an exemplary embodiment of the disclosure is shown in FIG. 6 and has a cross-section with completely enclosed gate, and the channel direction is the horizontal direction. Similarly, the above manufacturing method of the present disclosure is also applicable to a surrounding-gate device with a circular cross section, and the channel direction is also the horizontal direction. The circular cross section and the square cross section of the surrounding-gate in the above illustration refer to the cross section of the channel in the direction perpendicular to the channel.

It will be appreciated that the present disclosure is not limited to the exact construction that has been described above and illustrated in the accompanying drawings, and that various modifications and changes can be made without departing from the scope thereof. It is intended that the scope of the invention only be limited by the appended claims.

What is claimed is:

1. A manufacturing method for a FinFET device, wherein comprises following steps:

S01: providing an SOI substrate, wherein the SOI substrate includes a top silicon layer, a buried insulator layer, and a substrate sequentially from top to bottom, wherein the buried insulator layer is silicon dioxide;

S02: covering a middle part of the top silicon layer by using a barrier layer, and performing a silicon ion implantation on the top silicon layer, so that the buried insulator layer under the top silicon layer not covered by the barrier layer is converted into silicon-rich silicon dioxide, wherein in the top silicon layer, the part not covered by the barrier layer is called an implanted region, and the part covered by the barrier layer is called a non-implanted region;

S03: removing the barrier layer, define a fin structure in the top silicon layer, the fin structure includes a channel and a source and drain, the source and drain are located on opposite sides of the channel; and the channel in the fin structure is located in the non-implanted region of the top silicon layer, the source and drain are located in the implanted region of the top silicon layer; removing the top silicon layer outside the fin structure;

S04: removing the buried insulator layer under the channel in the fin structure to form a suspended channel;

S05: forming a completely surrounded dielectric film and a gate in sequence around the suspended channel;

S06: forming spacers and a source-drain doping in the structure.

2. The manufacturing method for a FinFET device according to claim 1, wherein the SOI substrate includes a p-type doped top silicon layer, the buried insulator layer, and a p-type doped substrate sequentially from top to bottom.

3. The manufacturing method for a FinFET device according to claim 1, wherein the channel in the fin structure has a circular cross section or a square cross section.

4. The manufacturing method for a FinFET device according to claim 1, wherein in the step S02, the silicon ion implantation is performed above the top silicon layer to ensure that the peak value of implanted silicon concentration distribution is in the buried insulator layer.

5. The manufacturing method for a FinFET device according to claim 1, wherein in the step S03, the top silicon layer outside the fin structure is removed by dry etching.

6. The manufacturing method for a FinFET device according to claim 1, wherein in the step S04, the buried insulator layer under the channel in the fin structure is removed by wet etching.

7. The manufacturing method for a FinFET device according to claim 6, wherein the wet etching uses HF as a wet etching agent.

8. The manufacturing method for a FinFET device according to claim 1, wherein the dielectric film is formed by one or more of high dielectric constant materials such as silicon dioxide, silicon nitride, and hafnium dioxide.

9. The manufacturing method for a FinFET device according to claim 1, wherein the gate is formed of polysilicon or metal materials.

10. The manufacturing method for a FinFET device according to claim 1, wherein the spacers are formed of insulating materials such as silicon dioxide and silicon nitride.

* * * * *